United States Patent [19]

Kowalski

[11] Patent Number: 4,896,298

[45] Date of Patent: Jan. 23, 1990

[54] READ CIRCUIT FOR MEMORY

[75] Inventor: Jacek Kowalski, Trets, France

[73] Assignee: SGS-Thomson Microelectronics SA, Paris, France

[21] Appl. No.: 147,902

[22] Filed: Jan. 25, 1988

[30] Foreign Application Priority Data

Jan. 27, 1987 [FR] France ................................ 87 00931

[51] Int. Cl.⁴ ................................................ G11C 7/00
[52] U.S. Cl. ................................ 365/189.01; 365/204; 365/185
[58] Field of Search ............... 365/189, 203, 230, 185, 365/189.01, 204

[56] References Cited

U.S. PATENT DOCUMENTS 4,475,178 10/1984 Kinoshita ............................ 365/203
4,545,038 10/1985 Bellay et al. ........................ 365/230

Primary Examiner—Joseph A. Popek
Attorney, Agent, or Firm—Oblon, Spivak, McClelland, Maier & Neustadt

[57] ABSTRACT

A read circuit is disclosed for logic circuit type integrated circuits comprising a memory consisting of a matrix of memory cells. The memory cells are each addressable by rows and columns selected by row and column decoders. The read circuit, which is connected to the memory cells by a line called a bit line, comprises a pre-loading circuit for the bit line and a detection circuit that detects the discharging or non-discharging of the bit line depending on whether the memory cell selected is in the state "0" or "1", and also comprises a means to memorize the state that is read. The circuit further comprises means which make it possible, in read mode, to discharge the bit line regardless of whether the memory cell is in the state "1" or "0" and means that delay the moment of discharge. The invention can be applied to EPROMs or similar memories.

8 Claims, 2 Drawing Sheets

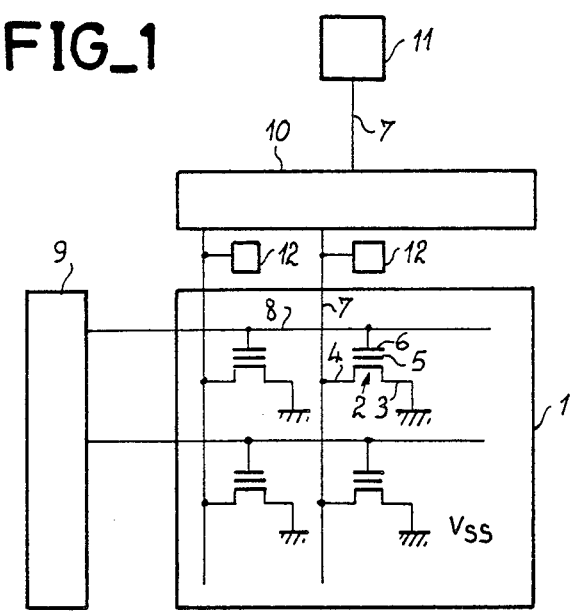
FIG_1
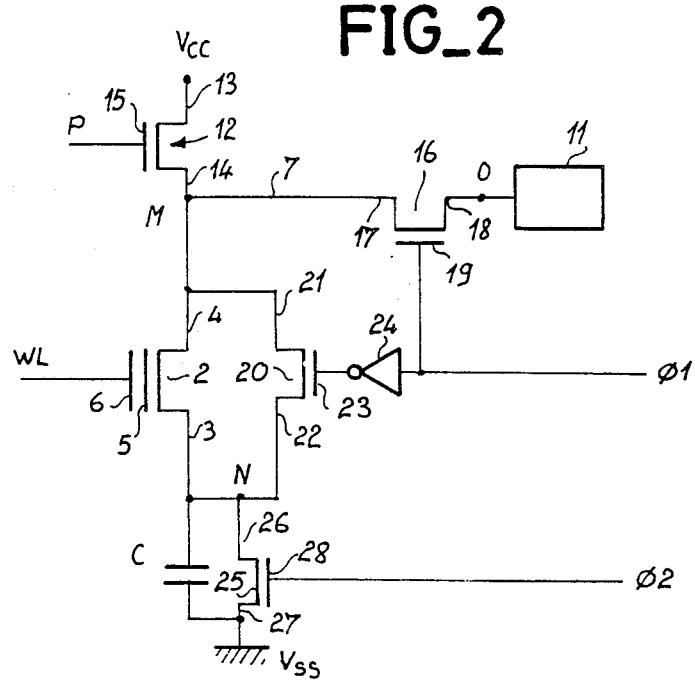
FIG_2

FIG_3
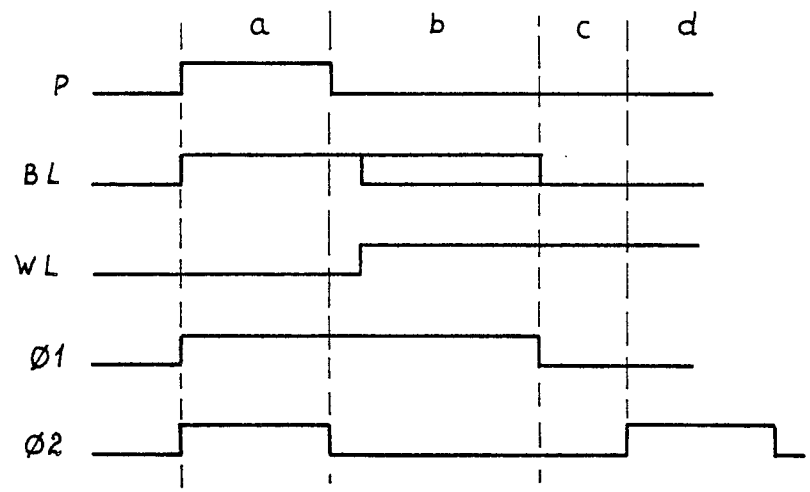
FIG_4
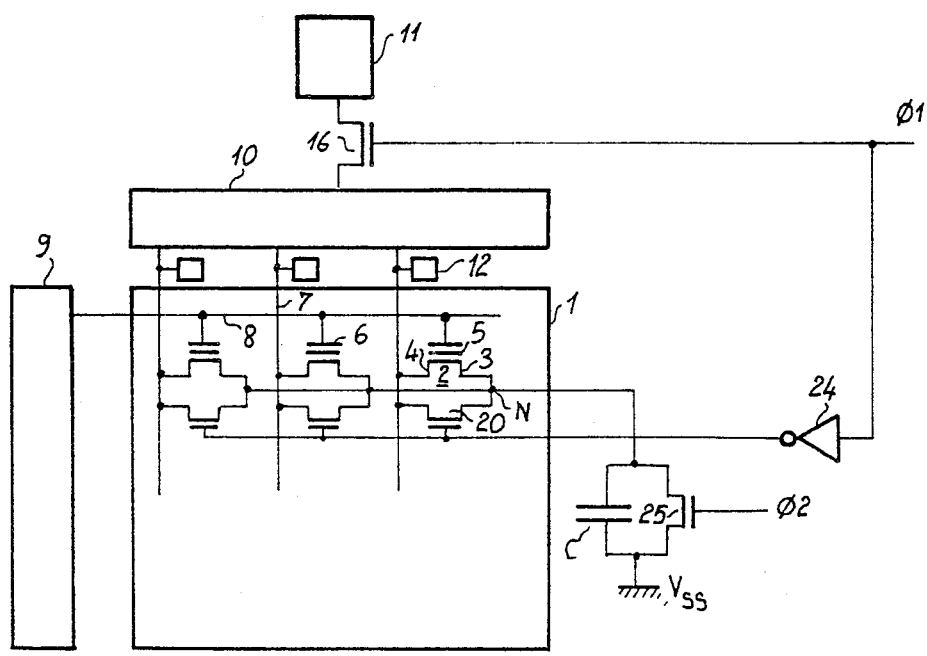

READ CIRCUIT FOR MEMORY

BACKGROUND OF THE INVENTION

1. Field of the Invention

The present invention pertains to a read circuit for a memory such as an electrically programmable non-volatile memory of the EPROM or EEPROM type, or any other memory comprising memory cells, the reading of which is done by the detection of a current or voltage variation in the bit line.

2. Description of the Prior Art

In EPROM or EEPROM type memories, for example, each data storage element or memory cell comprises a floating gate MOS transistor, which may be chiefly of the FAMOS (floating gate avalanche injection MOS) or SAMOS (stacked gate avalanche injection MOS) type. This type of transistor may have two states. Thus, in the case of an N-channel MOS transistor, in a first state, no charge or a positive charge is trapped at the floating gate. There may be a conduction channel between the source and the drain. The transistor is then conductive and behaves like a closed switch. In a second state, electrons are trapped at the floating gate. They therefore prevent the creation of a conduction channel in the substrate between the source and the drain. In this case, the transistor is off and behaves like an open switch.

To program a floating-gate MOS transistor, voltages higher than the normal operating voltage should be appropriately applied to the control gate and one of the electrodes in such a way that the floating gate can absorb and keep a charge of electrons. This charge of electrons at the floating gate raises the conduction threshold at the control gate of the transistor. Furthermore, to read a memory thus programmed, a voltage lower than the threshold voltage of the programmed floating gate MOS transistors but greater than the minimum voltage of the non-programmed transistors should be applied to the control gate. This read voltage makes it possible to detect whether the transistor is on or off. In general, the floating gate MOS transistor is connected by one of its electrodes to a bit line biased by a generator. Its other electrode is connected to the ground or to a low voltage. The bit line is also connected to a current or voltage sensor. This sensor measures the current put through the line by the generator. Thus, if the memory cell has not been programmed, the floating gate MOS transistor is on and when a read voltage which is higher than the threshold voltage of the non-programmed transistors is applied, the transistor becomes conductive. A variation in the current or a voltage drop is then detected on the sensor. In the second case, when the memory cell has been programmed, the charges are trapped at the floating gate of the transistor. In this case the read voltage applied to the control gate has a direction opposite to the potential barrier created in the conduction channel by the charges stored in the floating gate. However, this read voltage is then not enough to modify the conduction of the channel, and the transistor stays off. Consequently, the sensor at the end of the bit line does not perceive the current variation or voltage variation.

Thus, with an EPROM type memory as described above, the content of a memory cell can be read according to the consumption of the circuit, especially when the memory is read bit by bit.

This is especially inconvenient for memories used to receive confidential information because it then becomes easy to detect the nature of this information during a read operation.

SUMMARY OF THE INVENTION

It is an aim of the present invention to remove this disadvantage by proposing a read circuit that always shows a current consumption or a voltage variation regardless of whether the memory cell read is in a programmed state or a non-programmed state.

Consequently, an object of the present invention is a read circuit for integrated circuits of the logic circuit type, comprising a memory made up of a matrix of memory cells, the memory cells being each addressable by rows and columns selected by row decoders and column decoders, the read circuit being connected to the memory cells by a line called a bit line and comprising a circuit for the pre-loading of the bit line and a detection circuit that detects the discharging or non-discharging of the bit line depending on whether the state of the selected memory cell is at "0" or at "1" and also comprising means to memorize the state that is read, the said read circuit further comprising means that can be used, in read mode, to discharge the bit line regardless of whether the state of the memory cell is at "1" or at "0" and means that delay the moment of the discharge.

According to a preferred embodiment, the means used to discharge the bit line comprise the memory cell itself and a first switching means, connected between the bit line and the electrode connected to the low voltage of the memory cell or cells, the said means being closed after the reading.

Furthermore, the means that delay the moment of the discharge comprise a capacitor and a second switching means, such as a MOS transistor, parallel-mounted between the memory cell low voltage electrode and the low voltage $V_{ss}$ or ground, the switching means being closed once the discharge is done.

To enable an effective discharge of the bit line, the capacitance value of the capacitor used in the means that delay the moment of discharge is greater than the capacitance of the bit line, so that it is possible to bring down the bit line to a voltage close to the low voltage $V_{ss}$. Preferably, this capacitance will be at least equal to ten times the capacitance of the bit line.

BRIEF DESCRIPTION OF THE DRAWINGS

Other characteristics and advantages of the present invention will emerge from the following description of various embodiments, made with reference to the appended drawings, of which:

FIG. 1 schematically represents an EPROM capable of receiving the present invention;

FIG. 2 schematically represents a read circuit according to the present invention, as well as a memory cell of an EPROM;

FIG. 3 represents a timing diagram of the main control signals of the circuit of FIG. 2;

FIG. 4 schematically represents an EPROM provided with a read circuit according to the present invention.

To simplify the description, the same references are repeated for the same elements in the drawings. Furthermore, the description is made with reference to MOS circuits made in C MOS technology. However, it is obvious to the specialist that the present invention can be adapted to other technologies, in particular to N MOS technology.

DESCRIPTION OF PREFERRED EMBODIMENTS

FIG. 1 shows an EPROM type electrically programmable non-volatile memory 1. This memory is of the memory cell type consisting of a MOS transistor 2 with a floating gate 5. More specifically, the transistor 2 has two main electrodes, 3 and 4 respectively, a floating gate 5 and a control gate 6. A first main electrode, namely the source in the embodiment shown, is connected to a low voltage $V_{ss}$ or the ground while the other electrode 4, namely the drain, is connected to a line 7 called a bit line. The control gate 6 is connected to another connection 8 called a word line. The bit lines and word lines are arranged in rows and columns to determine a matrix including the memory cells, as shown in FIG. 1. This memory comprises means consisting essentially of a row decoder 9 and a column decoder 10 to apply, to the rows and columns, potentials representing data to be recorded in the memory cells or representing commands to read data recorded in the memory cells. Thus, to read a memory cell, the corresponding word line 8 is raised to a voltage produced by an output of the row decoder 9. By means of the column decoder 10, the state of the selected bit line is sent on the corresponding bit line 7. This bit line 7 is previously pre-loaded at the supply voltage $V_{cc}$ by means of a pre-loading circuit 12. The MOS transistor comes on or stays off depending on whether the charges have been previously trapped or not at its floating gate 5. A read circuit 11, further connected to an end of the bit line 7 by means of the column decoder 10 forming a multiplexer, detects the current variation or lack of current variation. From this, it deduces the fact that the memory cell is programmed at "1" or "0" respectively. Thus, with this type of memory, during the read operation a current consumption is either observed or not observed depending on the state of the memory cell. As mentioned in the introduction, this raises particular difficulties for memories that are read bit by bit and, moreover, contain data of a confidential type.

Referring to FIG. 2, we shall now describe an embodiment of a read circuit according to the present invention, making it possible to avoid the above problems.

The read circuit according to the present invention comprises means which make it possible, in the read mode, to discharge the bit line regardless of whether the said cell is in the state "1" or "0". These means consist essentially of the memory cell 2 itself and a MOS transistor 20 mounted in parallel on the memory cell 2. More specifically, one of the electrodes of the MOS transistor 20, namely the source 22, is connected to the source 3 of the memory cell 2, and the other electrode of the MOS transistor 20, namely the drain 21, is connected to the drain 4 of the memory cell 2, this drain being connected to the bit line 7. Furthermore, the gate 23 of the MOS transistor 20 is connected by an inverter to a read-enabling signal ∅1.

Furthermore, with the detection circuit itself, a means is included making it possible to store the state that is read. This means consists of a MOS transistor 16 having one of its electrodes 18 connected to the detection circuit 11 and its other electrode 17 connected to the node M of the bit line 7. The gate 19 of the transistor 16 receives the write enable signal ∅1 described below.

Furthermore, a circuit 12 for the pre-loading of the bit line is also connected to the node M. This pre-loading circuit 12 consists of a MOS transistor which has its source 14 connected to the node M and its drain 13 connected to the supply voltage $V_{cc}$. The control gate 15 receives a pre-loading signal P used to pre-load the bit line 7 at the supply voltage $V_{cc}$ before the reading of the memory cell 2.

So that the bit line is discharged, for the exterior, at the same instant regardless of whether the memory cell is in the state "1" or "0", the read circuit furthermore has means that delay the moment of the discharge. These means essentially consist of a capacitor C which is parallel-mounted with a switching means 25 between the node N, common to the sources 3 and 22 of the memory cell 2 and the MOS transistor 20, and the low voltage $V_{ss}$ or the ground. The purpose of the capacitor C is to store the charges obtained when discharging the bit line whether this discharging is done through the memory cell 2 when it is programmed at "0" or through the MOS transistor 20 which is turned on after the reading of the memory cell 2 when the said memory cell 2 is programmed at "1". Subsequently, the capacitor C will be discharged when the switching means 25 is closed. These switching means consists of a MOS transistor 25 having one of its electrodes 26 connected to the node N and its other electrode 27 to the ground or the low voltage while its gate 28 receives a signal ∅2 controlling the conduction or non-conduction of the MOS transistor 20.

Referring to the timing diagram of FIG. 3, we shall now explain the functioning of the read circuit shown in FIG. 2.

Thus, during the period a, the pre-loading signal P and the signal ∅2 are positioned at the logic level "1".

Consequently, the bit line 7 is pre-loaded at the supply voltage $V_{cc}$ as shown by the signal BL, and the capacitor C is discharged through the MOS transistor 25 which becomes conductive so that the node N is at a voltage that is substantially equal to the low voltage $V_{ss}$ or ground. At the end of this pre-loading period, the signals P and ∅2 return to the logic level "0". Subsequently, during the period b a read command WL is sent to the control gate 6 of the memory cell 2, i.e. the signal WL goes to the logic level "1". If the memory cell 2 is programmed at "0", this cell becomes conductive and the bit line 7 is discharged in the capacitor C through the memory cell 2. If, on the contrary, the memory cell 2 is programmed at "1", the said memory cell 2 is off and, in that case, the bit line stays at the supply voltage $V_{cc}$. During the periods and b , the read-enable signal ∅1 is positioned at the logic level "1" so that the MOS transistor 16 comes on. Consequently, the node O between the MOS transistor 16 and the detection circuit 11 is at the logic level "1" or at the logic level "0", depending on whether the memory cell is in the programmed state or the non-programmed state. Furthermore, the MOS transistor 20, the gate 23 of which is controlled by the signal ∅1, is off.

During the period c, the signal ∅1 goes to the logic level "0" causing the MOS transistor 16 to go off so that the node O memorizes the state of the memory cell detected. Simultaneously, the MOS transistor 20 comes on and the bit line 7 is discharged in the capacitor C through the transistor 20 if the bit line has not already been discharged through the memory cell 2. During the period d the signal ∅2 goes to the logic level "1" so as to achieve the discharge of the capacitor C at the voltage $V_{ss}$ through the MOS transistor 25. In fact, this time can be eliminated and the discharge can be done during the pre-loading of the bit line. In this case the signal ∅2 may consist of the pre-loading signal $\overline{P}$ or the inverted pre-loading signal depending on the type of MOS transistors 12 and 25 used. In the embodiment shown, the MOS transistors 12 and 25 are N-type transistors. However, it is obvious to the specialist that P-type transistors can be used for both the transistors 15 and 20 or for either of these transistors. Similarly, the MOS transistors 20 and 16 also consist of N-type MOS transistors, but P-type MOS transistors can also be used.

According to another characteristic of the present invention, the capacitance value of the capacitors C should be higher than the capacitance of the bit line 7, in order to obtain, at the node N, voltage which is low enough to enable a discharge of the bit line. Preferably, the capacitance value of the capacitor C will be substantially equal to at least ten times the value of the capacitance of the bit line. For, after the distribution of the charges between the capacitor C and the capacitance $C_{BL}$ of the bit line, the voltage at the node N is equal to:

$$Vn = \frac{C_{BL}}{C + C_{BL}} V_{cc}$$

If, $C = 10 \, C_{BL}$ and $V_{cc} = 5$ volts, we thus get:

$Vn \sim 0,45$ volt

Furthermore, the fact that the bit line is discharged in the capacitor C makes it possible to prevent a time difference in the moment of the bit line discharge according to whether the bit line is discharged through the memory cell or through the MOS transistor 20, for the transistor only becomes active once the read operation is done.

FIG. 4 shows a read circuit according to the present invention applied to a matrix of memory cells.

In this case, it is observed that the means delaying the moment of the discharge, consisting of the capacitor C and the MOS transistor 25, parallel-mounted between the node N and the low voltage $V_{ss}$, are common to all the memory cells controlled by one and the same bit line 8, or even to all the memory cells of the matrix 1. Furthermore, as shown in this figure, the MOS transistor 20 is mounted between the bit line 7 and the nodes N common to all the memory cells, and all the gates of the transistors 20 are connected by means of the inverter 24 to the signal ∅1. Furthermore, the MOS transistor 16 is common to all the bit lines 7, and is positioned between the detection circuit 11 and the column decoder 10 forming a muliplexer. The functioning of this circuit is identical to the functioning of the circuit described with reference to FIG. 2.

The present invention has been described with reference to an EPROM. It is obvious that it can be applied to an EEPROM or to any memory, the memory cells of which are read by pre-loading a bit line and by detecting a current variation or voltage variation on the bit line.

What is claimed is:

1. A reading circuit for a matrix of memory cells, said cells being arranged in rows and columns, the cells belonging to a common column being connected to a common corresponding bit line, said circuit comprising:
   a precharge circuit for precharging said bit line to a precharge voltage prior to a reading operation; and
   a detection circuit connected to said bit line and activated by a reading signal, said detection circuit detecting the discharge of said precharge bit line during a read operation and said discharge being dependant upon the logical state of an addressed cell of said memory cells which addressed cell is connected to said bit line and said reading circuit further comprising means for systematically discharging said bit line after the read operation whether or not said bit line has been discharged during the read operation.

2. A reading circuit according to claim 1, wherein said means for systematically discharging the bit line comprises a transistor connected to the bit line and capable of being rendered conductive by an enabling signal following said reading signal.

3. A reading circuit according to claim 2, further comprising a transistor connected between said bit line and said detection circuit, said transistor being rendered conductive during said read operation and being rendered non-conductive by said enabling signal output from said means for a systematically discharging said bit line.

4. A reading circuit according to claim 1, further comprising a capacitor connected in series with said cell, between said bit line and a ground supply terminal, and a means for short-circuiting said capacitor prior to said read operation and for allowing charging of said capacitor during said read operation.

5. A reading circuit according to claim 4 wherein said means for short circuiting the capacitor comprises a transistor activated by a short-circuiting signal occurring prior to said read operation.

6. A reading circuit according to claim 5, wherein said short-circuiting signal occurs substantially simultaneous with the precharging of said bit line.

7. A reading circuit according to claim 4, wherein said capacitor has a capacitance of at least approximately ten times the capacitance of said bit line.

8. A reading circuit according to claim 4, wherein said capacitor is common to the cells of one or more bit lines.

* * * * *